United States Patent
Chen et al.

(10) Patent No.: US 7,820,473 B2
(45) Date of Patent: Oct. 26, 2010

(54) SCHOTTKY DIODE AND METHOD OF MANUFACTURE

(75) Inventors: Linghui Chen, Gilbert, AZ (US); Blanca Estela Kruse, Arizona City, AZ (US); Mark Duskin, Scottsdale, AZ (US); John D. Moran, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 403 days.

(21) Appl. No.: 11/084,524

(22) Filed: Mar. 21, 2005

(65) Prior Publication Data

US 2006/0211227 A1    Sep. 21, 2006

(51) Int. Cl.
  *H01L 21/00*    (2006.01)
(52) U.S. Cl. .................. 438/92; 438/167; 438/169; 438/534; 438/570; 257/E21.359; 257/E21.368
(58) Field of Classification Search ........... 438/92, 438/167, 169, 534, 570; 257/E21.359, E21.368
See application file for complete search history.

(56) References Cited

U.S. PATENT DOCUMENTS

| | | | | |
|---|---|---|---|---|
| 3,541,403 | A | * | 11/1970 | Sze et al. .................. 257/484 |
| 4,035,907 | A | * | 7/1977 | Allen et al. ................ 438/534 |
| 4,062,033 | A | * | 12/1977 | Suzuki ....................... 257/474 |
| 4,357,178 | A | | 11/1982 | Bergeron et al. |
| 4,720,734 | A | | 1/1988 | Amemiya et al. |
| 4,899,199 | A | | 2/1990 | Gould |
| 5,060,047 | A | | 10/1991 | Jaume et al. |
| 5,075,740 | A | | 12/1991 | Ohtsuka et al. |
| 5,614,755 | A | | 3/1997 | Hutter et al. |
| 5,859,465 | A | | 1/1999 | Spring et al. |
| 6,083,835 | A | * | 7/2000 | Shue et al. .................. 438/687 |
| 6,624,472 | B2 | | 9/2003 | Hurkx et al. |
| 6,660,570 | B2 | | 12/2003 | Kim et al. |

OTHER PUBLICATIONS

"Microwave Encyclopedia" that is located at the web address http://www.microwaves101.com/encyclopedia/conductivity.cfm#semiinsulator. Visited Feb. 10, 2008. 5 pages.
Wikipedia webpage located at http://en.wikipedia.org/wiki/List_of_semiconductor_materials. Titled "List of semiconductor materials." Visited on Feb. 2, 2008. 3 pages.

* cited by examiner

*Primary Examiner*—Thanh V Pham
(74) *Attorney, Agent, or Firm*—Rennie William Dover

(57) ABSTRACT

A Schottky diode capable of sustaining a voltage of greater than about 250 volts and a method for its manufacture. An epitaxial layer of N-type conductivity is disposed on a semiconductor substrate of N-type conductivity. A guard ring of P-type conductivity extends into the epitaxial layer from its surface. A stacked structure is formed on a portion of the guard ring and a portion of the epitaxial layer. The stacked structure includes a layer of semi-insulating semiconductor material disposed on a layer of dielectric material. A first metal layer is formed on the portion of the epitaxial layer adjacent a first side of the stacked structure and on a first portion of the stacked structure. A second metal layer is formed on the portion of the epitaxial layer adjacent a second side of the stacked structure and on a second portion of the stacked structure.

13 Claims, 5 Drawing Sheets

SCHOTTKY DIODE AND METHOD OF MANUFACTURE

FIELD OF THE INVENTION

This invention relates, in general, to a semiconductor device and, more particularly, to a Schottky diode.

BACKGROUND OF THE INVENTION

Schottky diodes are well suited for use in high frequency applications because they have short reverse recovery times and low forward voltages, i.e., low losses. However, they have breakdown voltages of less than 200 volts which limits their use to low voltage applications. Schottky diodes are typically comprised of a high work function metal in contact with an N-type conductivity epitaxial layer which is grown on a substrate material of N-type conductivity. Techniques for increasing the breakdown voltage have included increasing the thickness of the epitaxial layer, increasing the resistance of the epitaxial layer, and forming a guard ring in the epitaxial layer. A drawback with these techniques is that they also increase the forward voltage and decrease the switching speed of the Schottky diode.

Accordingly, it would be advantageous to have a Schottky diode capable of withstanding a large reverse bias voltage while having a low forward voltage drop and fast switching characteristics. It would be of further advantage for the method for manufacturing the Schottky diode to be cost and time efficient and compatible with Schottky diode manufacturing processes.

SUMMARY OF THE INVENTION

The present invention satisfies the foregoing need by providing a Schottky diode and a method for manufacturing the Schottky diode. In accordance with one embodiment, the present invention comprises a method for manufacturing a Schottky diode having a breakdown voltage of at least about 250 volts by providing a semiconductor material of a first conductivity type and having a major surface and forming a guard ring of a second conductivity type in the semiconductor material. A layer of semi-insulating semiconductor material is formed over a portion of the guard ring. An electrically conductive material is formed over a portion of the major surface.

In accordance with another embodiment, the present invention comprises a method for manufacturing a Schottky diode having a reverse voltage of at least about 250 volts by providing a semiconductor substrate of a first conductivity type and having first and second major surfaces. A layer of epitaxial material of the first conductivity type is formed on the first major surface. A first layer of dielectric material is formed on the layer of epitaxial material and an opening is formed in the first layer of dielectric material, wherein the opening exposing a portion of the layer of epitaxial material. A guard ring of a second conductivity type is formed in the layer of epitaxial material and extends from the exposed portion of the layer of epitaxial material into the layer of epitaxial material. A semi-insulating semiconductor material is formed over a portion of the guard ring and an electrically conductive material is formed on the layer of epitaxial material.

In accordance with another embodiment, the present invention includes a Schottky diode comprising a semiconductor material having first and second major surfaces. A guard ring extends from the first major surface into the semiconductor material. A stacked structure having first and second sides is disposed on the first major surface, wherein the stacked structure comprises a first dielectric material disposed on a portion of the first major surface and a portion of the guard ring and a semi-insulating semiconductor material disposed on the first dielectric material. A first electrically conductive material is disposed on a portion of the stacked structure and on a first portion of the first major surface adjacent the first side and within the stacked structure and a second electrically conductive material is disposed on a second portion of the stacked structure and a portion of the first major surface adjacent the second side of the stacked structure, wherein the first and second electrically conductive materials are spaced apart from each other. A third electrically conductive material is disposed on the second major surface.

BRIEF DESCRIPTION OF THE DRAWINGS

The present invention will be better understood from a reading of the following detailed description, taken in conjunction with the accompanying drawing figures, in which like reference numbers designate like elements, and in which.

It should be understood that the drawings are not drawn to scale.

DETAILED DESCRIPTION

Generally, the present invention provides a Schottky diode having a reverse breakdown voltage of greater than about 250 volts and a method for manufacturing the Schottky diode. In prior art Schottky diodes comprising a metal in contact with an N-type conductivity epitaxial layer that is disposed on an N-conductivity type substrate and a guard ring of P-type conductivity the breakdown voltages are less than 200 volts. In these devices, as their breakdown voltages approach 200 volts their switching speeds become unacceptably slow. The inventors have discovered that including a layer of a semi-insulating semiconductor material such as, for example, semi-insulating polycrystalline silicon creates Schottky diodes having breakdown voltages of greater than about 250 volts and even greater than about 300 volts while maintaining the switching speeds. This unexpected result allows for the manufacture of Schottky diodes from silicon that are suitable for use in high frequency, low forward voltage, and high breakdown voltage applications.

Figure 1:
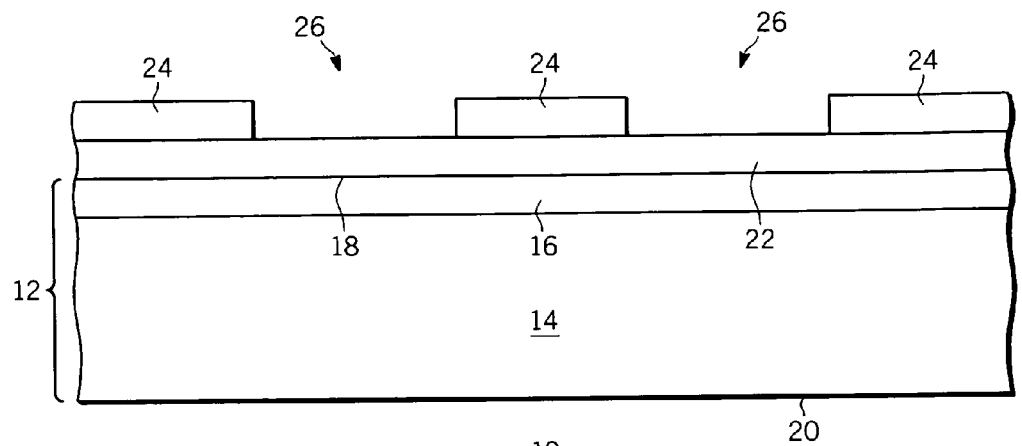
FIG. 1 is cross-sectional side view of a Schottky diode at an early stage of manufacture in accordance with an embodiment of the present invention.

FIG. 1 is a cross-sectional side view of a portion of a Schottky diode 10 at an early stage of manufacture in accordance with an embodiment of the present invention. What is shown in FIG. 1 is a semiconductor material 12 comprising a monocrystalline semiconductor substrate 14 having an epitaxial layer 16 disposed thereon. Epitaxial layer 16 has a major surface 18 which serves as the top surface of semiconductor material 12 and substrate 14 has a major surface 20 which serves as the bottom surface of semiconductor material 12. By way of example, semiconductor substrate 14 and epitaxial layer 16 are of N-type conductivity, wherein the concentration of N-type dopant or impurity material in semiconductor substrate 14 is greater than that of epitaxial layer 16. In accordance with one embodiment, epitaxial layer 16 has a thickness of at least about 18 micrometers ($\mu$m). Preferably, substrate 14 is doped with phosphorus having a concentration of at least about $1\times10^8$ atoms per cubic centimeter (atoms/cm$^3$) and epitaxial layer 16 is doped with phosphorus having a concentration ranging from about $1\times10^{14}$ atoms/cm$^3$ to about $1\times10^{15}$ atoms/cm$^3$. Even more preferably, epitaxial layer 16 is doped with phosphorus having a concentration of about $5\times10^{14}$ atoms/cm$^3$. It should be understood that the conductivity types and dopant concentrations of substrate 14 and epitaxial layer 16 are not limitations of the present invention. For example, substrate 14 and epitaxial layer 16 can be doped with an impurity material of P-type conductivity. It should be further understood that substrate 14 is optional and may be omitted from semiconductor component 10.

A layer of dielectric material 22 having a thickness ranging from about 40 Angstroms (Å) to about 15,000 Å is formed on epitaxial layer 16. By way of example, dielectric layer 22 is a TEOS layer formed by the decomposition of tetraethyl orthosilicate. Other suitable dielectric materials include thermally grown oxides, deposited oxides, silicon nitride (SiN), silicon oxynitride (SiON), silicon rich nitride (SiRN), silicon carbide (SiC), hydrogenated oxidized silicon carbon material (SiCOH), or the like. A layer of photoresist 24 is formed on dielectric layer 22 and patterned to have an opening 26 that exposes a portion of dielectric layer 22. In accordance with one embodiment, opening 26 has an annular-shape. Thus, the cross-sectional view of FIG. 1 illustrates two portions of opening 26. It should be understood that the shape of opening 26 is not limitation of the present invention, i.e., it can be circular, triangular, quadrilateral, pentagonal, or other polygonal shapes.

Figure 2:
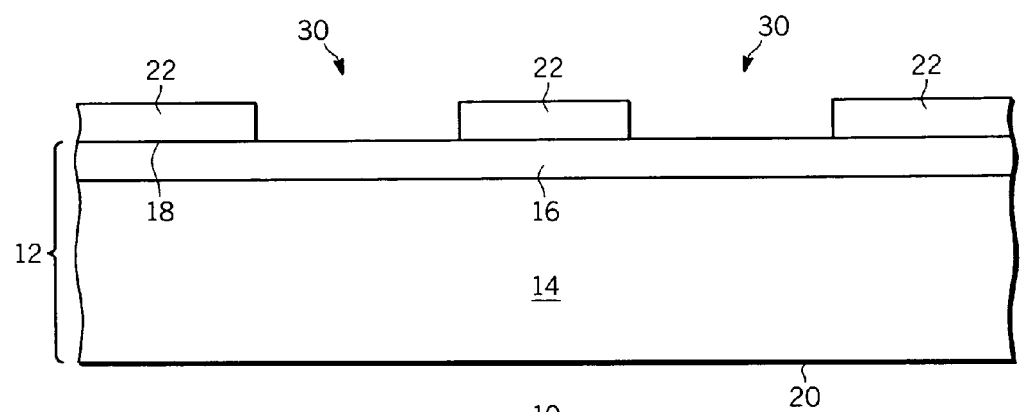
FIG. 2 is a cross-sectional side view of the Schottky diode of FIG. 1 at a later stage of manufacture.

Referring now to FIG. 2, the exposed portion of dielectric layer 22 is etched using, for example, an anisotropic reactive ion etch. In accordance with one embodiment, epitaxial layer 16 serves as an etch stop, wherein the etch forms an annular-shaped opening or groove 30 in dielectric layer 22 that exposes a portion of epitaxial layer 16. It should be understood that the etch may be either an isotropic etch or an anisotropic etch. A thin screen oxide layer may be formed on the exposed portion of epitaxial layer 16. Alternatively, the etch may be terminated to leave a thin portion of dielectric layer 22 which serves as a screen oxide.

Figure 3:
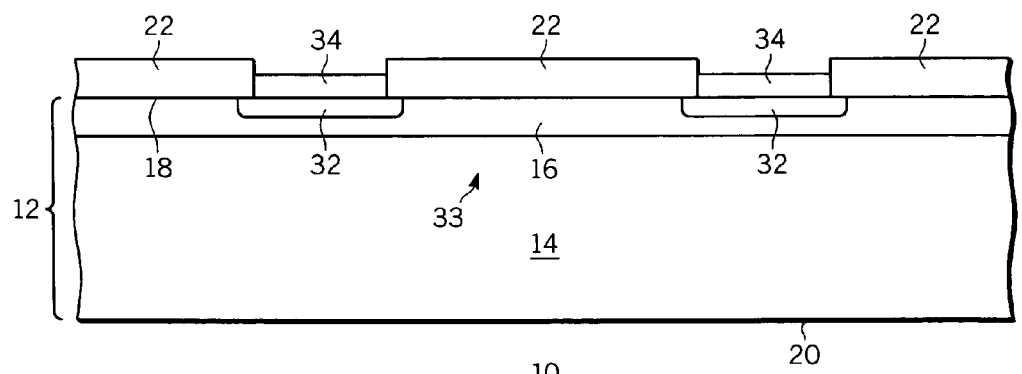
FIG. 3 is a cross-sectional side view of the Schottky diode of FIG. 2 at a later stage of manufacture.

Referring now to FIG. 3, an impurity material of P-type conductivity such as, for example, boron, is implanted through opening 30 into the exposed portions of epitaxial layer 16 to form a guard ring 32 that surrounds an active area 33. Other suitable P-type conductivity impurity materials include indium, aluminum, or the like. Because opening 30 has an annular shape, guard ring 32 also has an annular shape. Thus, the shape of guard ring 32 follows from that of opening 30. By way of example, the boron is implanted at a dose ranging from about $7\times10^{12}$ atoms per square centimeter (atoms/cm$^2$) to about $3\times10^{13}$ atoms/cm$^2$ and at an implant energy ranging from about 40 kilo-electron Volts (KeV) to about 150 KeV. The dopant forming guard ring 32 preferably extends at least 0.3 $\mu$m into epitaxial layer 16 from surface 18, and more preferably from about 0.6 $\mu$m to about 0.8 $\mu$m into epitaxial layer 16 from surface 18. It should be understood that the shape of guard ring 32 is not limitation of the present invention, i.e., it can be circular, triangular, quadrilateral, pentagonal, or other polygonal shape as long as guard ring 32 surrounds active area 33.

A dielectric layer 34 having a thickness ranging from about 500 Å to about 10,000 Å is formed on the exposed portion of epitaxial layer 32. In accordance with one embodiment, the formation of guard ring 32 and dielectric layer 34 occurs contemporaneously with each other. In other words, the process of diffusing the dopant that forms guard ring 32 also oxidizes the exposed portion of epitaxial layer 16, thereby forming dielectric layer 34. Like guard ring 32, dielectric layer 34 has an annular shape. It should be noted that during the formation of dielectric layer 34 silicon at the interface between dielectric layer 22 and epitaxial layer 16 becomes oxidized thereby increasing the thickness of dielectric layer 22.

Figure 4:
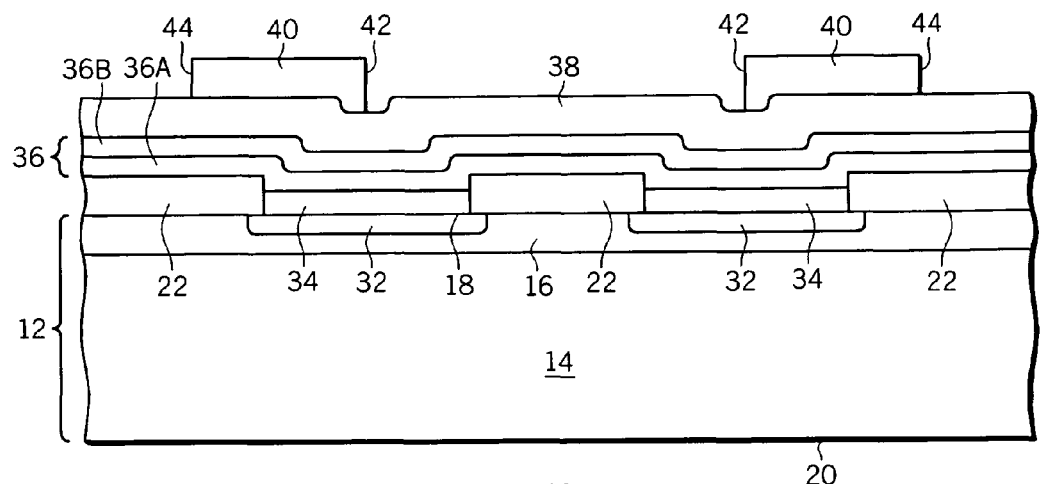
FIG. 4 is a cross-sectional side view of the Schottky diode of FIG. 3 at a later stage of manufacture.

Referring now to FIG. 4, one or more layers of a semi-insulating semiconductor material 36 are formed on dielectric layers 22 and 34. It should be noted that FIG. 4 has been enlarged for the sake of clarity. Suitable materials for semi-insulating semiconductor material 36 include, but are not limited to, semi-insulating polycrystalline silicon, i.e., SIPOS, and alpha-Silicon. In accordance with one embodiment, semi-insulating semiconductor material 36 comprises two layers 36A and 36B. Layer 36B is disposed on layer 36A which contacts dielectric layers 22 and 34. Preferably, layer 36B has a lower resistivity than layer 36A. The number of layers of semi-insulating semiconductor 36 is not a limitation of the present invention.

A layer of dielectric material 38 is formed on semi-insulating semiconductor material 36. By way of example, dielectric layer 38 is TEOS.

A layer of photoresist is formed on dielectric layer 38 and patterned to form an annular-shaped etch mask 40 which is positioned above annular-shaped dielectric layer 34 and annular-shaped guard ring 32. Etch mask 40 has an inner side 42 and an outer side 44 and is formed such that inner side 42 is above dielectric layer 38, SIPOS layer 36, and dielectric layer 34 and outer side 44 is above dielectric layer 38, SIPOS layer 36, and dielectric layer 22.

Figure 5:
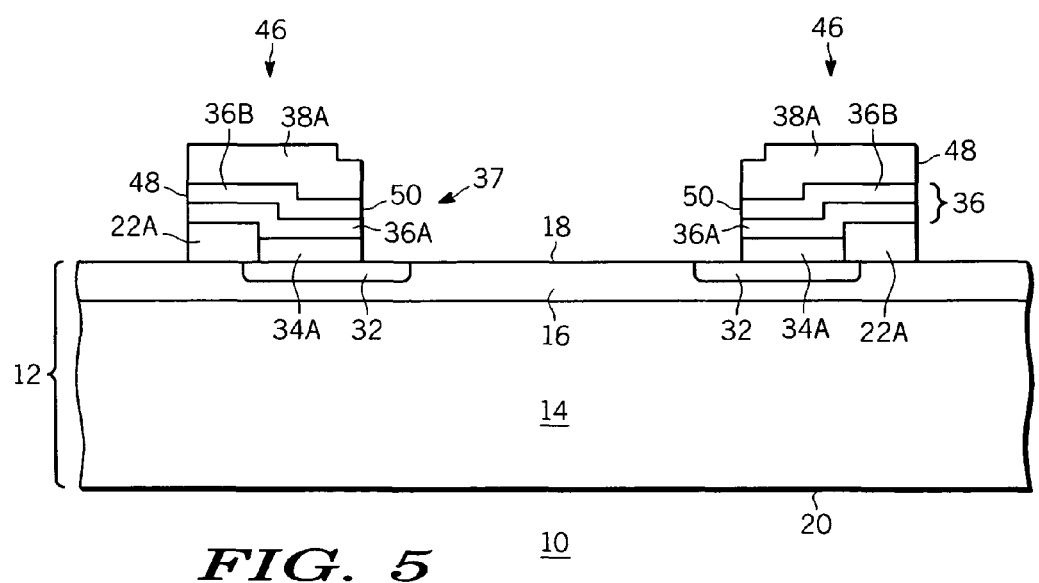
FIG. 5 is a cross-sectional side view of the Schottky diode of FIG. 4 at a later stage of manufacture.

Referring now to FIG. 5, the portions of dielectric layer 38, SIPOS layer 36, dielectric layer 22, and a portion of annular-shaped dielectric layer 34 that are unprotected by etch mask 40 are etched using either an isotropic etch or an anisotropic etch. By way of example, the etch is an anisotropic reactive ion etch. After the etch, the portion of epitaxial layer surface 18 that is within guard ring 32 and a portion of guard ring 32 are exposed. The etch forms a stacked structure 46 having sides 48 and 50. A portion of stacked structure 46 remains on epitaxial layer 16 and a portion remains on guard ring 32. In accordance with one embodiment, stacked structure 46 comprises three layers, wherein a lower layer includes a portion 22A of dielectric layer 22 and a portion 34A of dielectric layer 34. A portion 37 of SIPOS layer 36 remains on portions 22A and 34A and is an intermediate layer. A portion 38A of dielectric layer 38 remains on portion 37 and is an upper layer. The portion of epitaxial layer 16 adjacent side 48 of stacked structure 46 is exposed.

Figure 6:
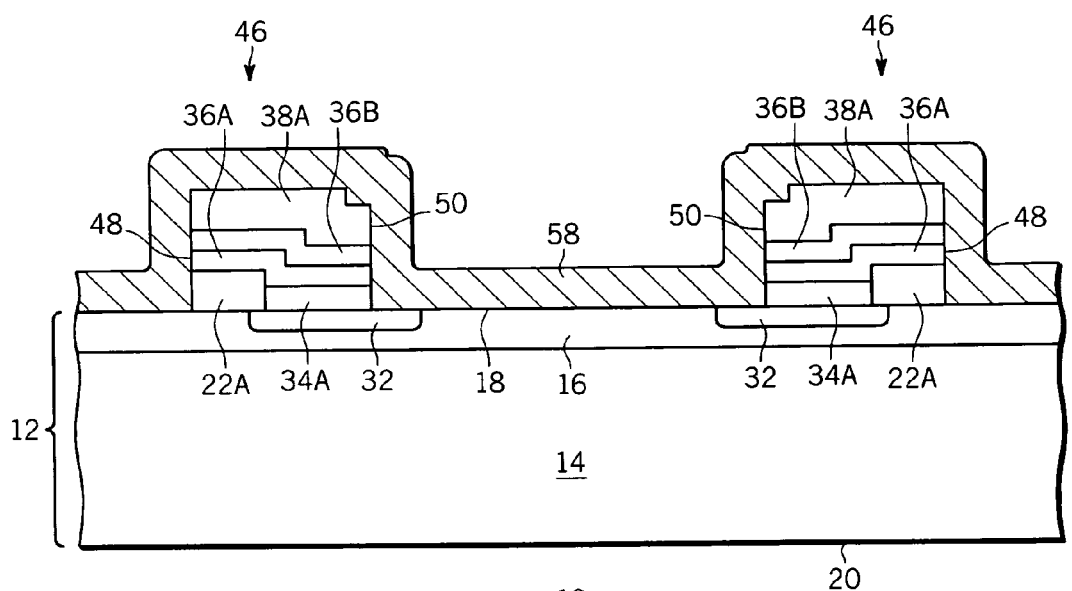
FIG. 6 is a cross-sectional side view of the Schottky diode of FIG. 5 at a later stage of manufacture.

Referring now to FIG. 6, a refractory metal layer 58 such as, for example, platinum is conformally deposited on the exposed portions of epitaxial layer 16, guard ring 32, and stacked structure 46. Suitable refractory metals include platinum, tungsten, titanium, nickel, cobalt, or the like. Refractory metal layer 58 is heated to form a metal silicide (shown in FIG. 7) in all regions in which the refractory metal is in contact with silicon. Refractory metal layer 58 may be heated in an oven, during deposition, or during a subsequent processing step.

Figure 7:
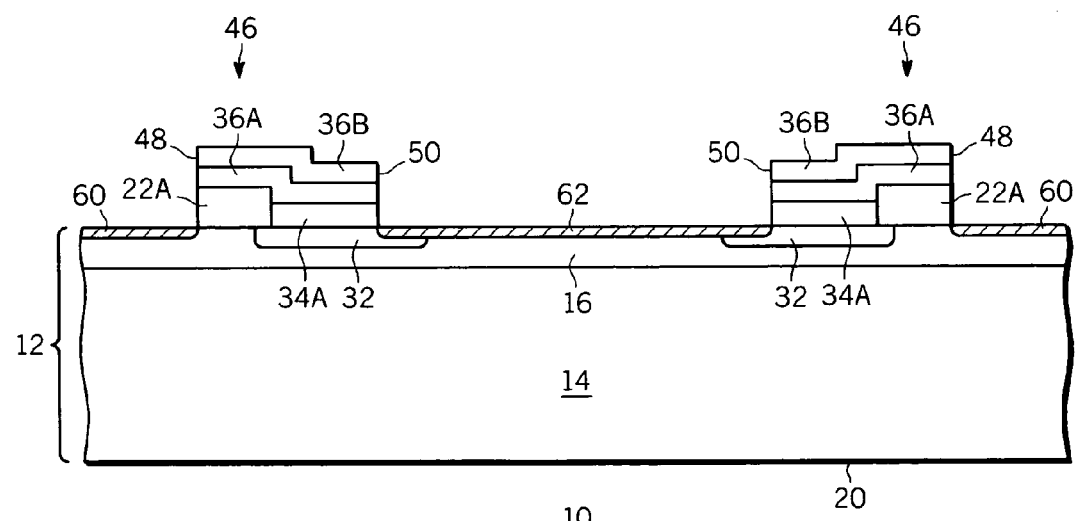
FIG. 7 is a cross-sectional side view of the Schottky diode of FIG. 6 at a later stage of manufacture.

Referring now to FIG. 7, a metal silicide layer 60 is formed from the portion of epitaxial layer 16 adjacent side 48 of stacked structure 46 and metal silicide layer 62 is formed from the portion of epitaxial layer 16 within annular-shaped stacked structure 46. The portions of the refractory metal on non-silicon regions remain unreacted. In accordance with one embodiment, the unreacted refractory metal is removed using processes known to those skilled in the art. In accordance with another embodiment, the unreacted refractory metal is not removed. It should be understood that the type of silicide is not a limitation of the present invention. Suitable silicides include titanium silicide, platinum silicide, nickel silicide, cobalt silicide, tungsten silicide, combinations thereof, or the like. It should be further understood that silicide layers 60 and 62 are optional layers that may be omitted. For example, refractory metal layer 58 can serve as the conductive metal and the portion of refractory metal layer 58 that becomes silicide serves as a barrier layer. Portion 38A of dielectric layer 38 is removed.

Figure 8:
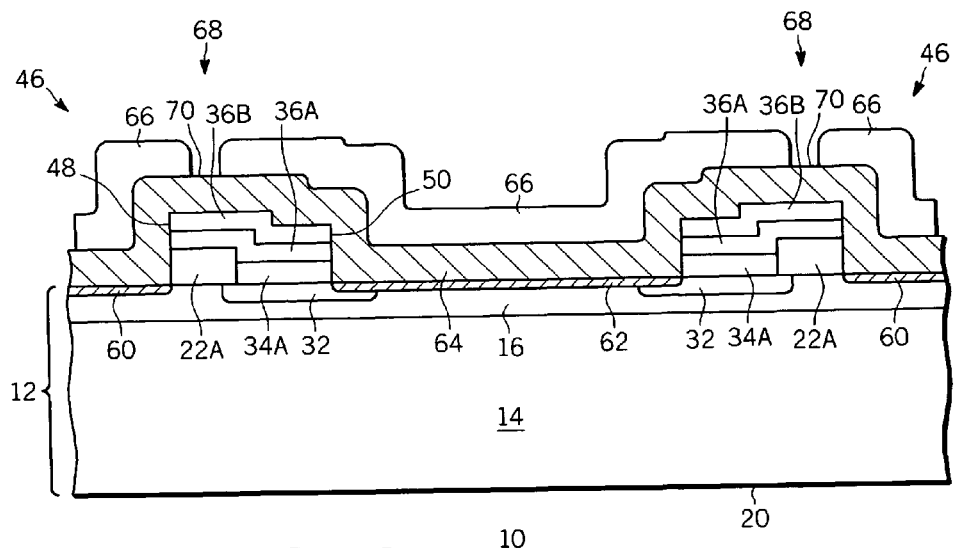
FIG. 8 is a cross-sectional side view of the Schottky diode of FIG. 7 at a later stage of manufacture.

Referring now to FIG. 8, a metal layer 64 is formed on silicide layers 60 and 62 and on stacked structure 46. A layer of photoresist 66 is formed on metal layer 64 and patterned to form an annularly-shaped opening 68 and to expose portion 70 of metal layer 64.

Figure 9:
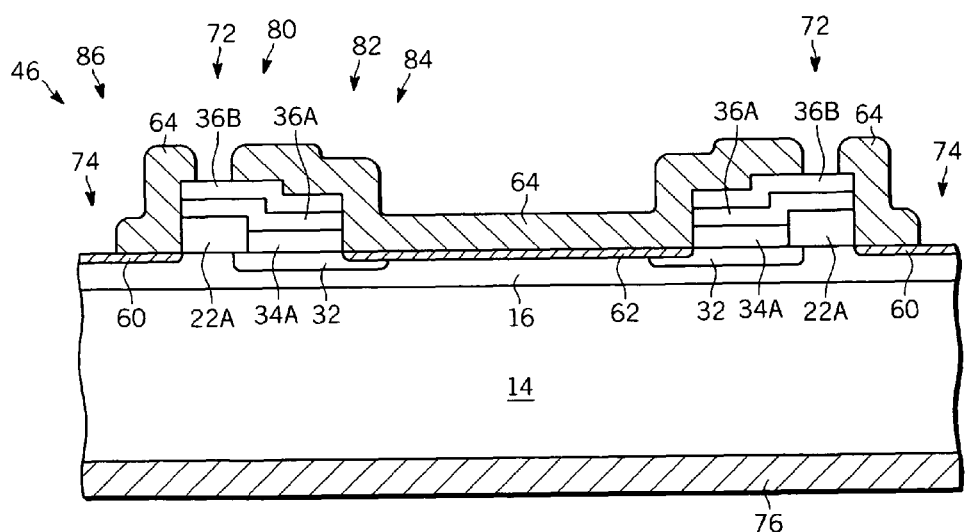
FIG. 9 is a cross-sectional side view of the Schottky diode of FIG. 8 at a later stage of manufacture.

Referring now to FIG. 9, the portion of metal layer 64 exposed by annular-shaped opening 68 is etched to form an annular-shaped opening 72 in the portion of metal layer 64 over stacked structure 46 and to remove portion 70 of metal layer 64. Opening 72 exposes portion 36B of semi-insulating semiconductor material 36. Removal of portion 70 exposes the portion 74 of Schottky diode 10 adjacent to, but laterally spaced apart from, side 48 of stacked structure 46. Rings 80, 82, 84, and 86 are described in conjunction with FIG. 10.

A layer of electrically conductive material 76 is disposed on surface 20 of substrate 14. Materials for electrically conductive layer 76 are known to those skilled in the art.

Figure 10:
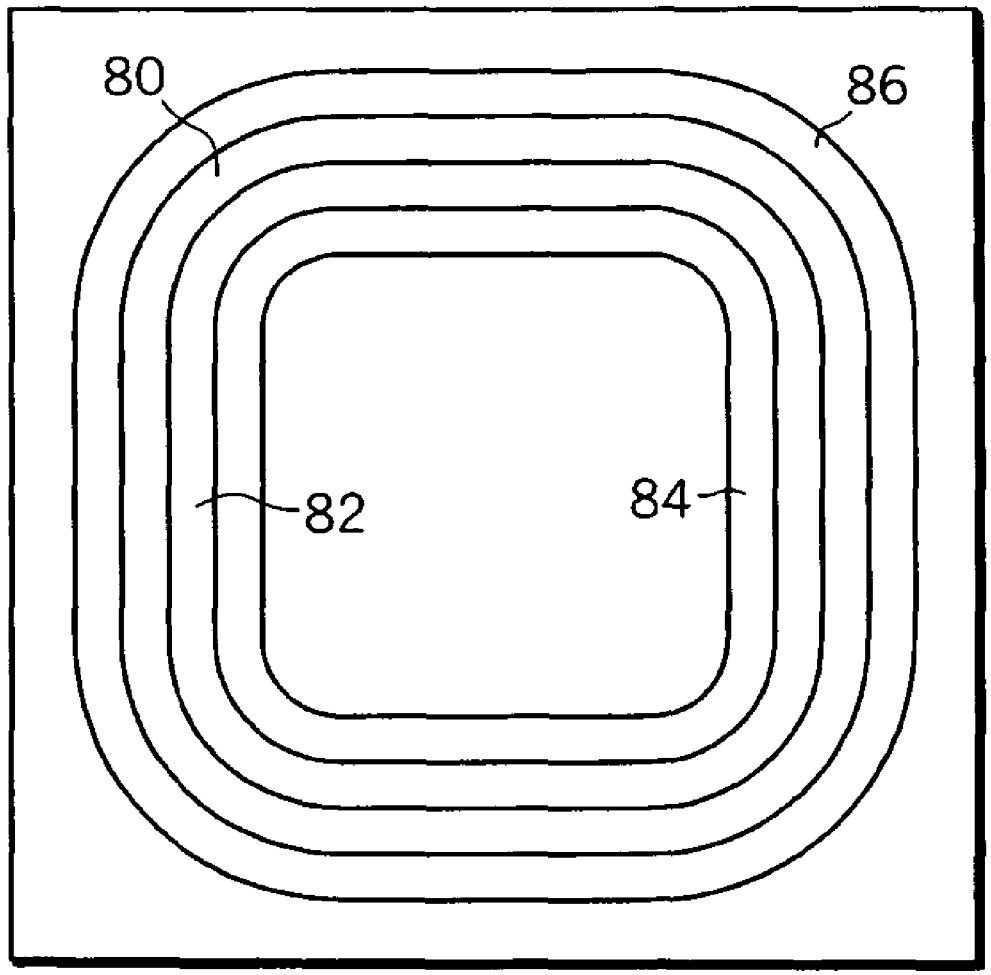
FIG. 10 is a top view of the Schottky diode of FIG. 9.

Referring now to FIG. 10, a top view of Schottky diode 10 of FIG. 9 is illustrated. What is shown in FIG. 10 are the annular or ring structures of stacked structure 46 and the regions of Schottky diode 10 adjacent stacked structure 46. More particularly, annular region 80 results from light reflected from portion 22A and portion 36B of stacked structure 46, and annular region 82 results from light reflected by portion 34A and portion 36B of stacked structure 46. Annular region 84 results from light reflected from metal layer 64, silicide layer 62, and guard ring 32. Annular region 86 results from light reflected from the portion of metal layer 64 adjacent side 48 of stacked structure 46.

By now it should be appreciated that a Schottky diode having a breakdown voltage of greater than about 250 volts and a switching speed of less than about 200 nanoseconds (nsec) and a method for manufacturing the Schottky diode have been provided. The Schottky diode of the present invention offers these performance advantages while being manufactured using conventional semiconductor processing. Thus, it is cost efficient to manufacture. In addition to a lower cost manufacturing process, the materials for manufacturing the Schottky diode are low cost and the cycle times for its manufacture are short. Schottky diodes manufactured in accordance with the present invention not only have high breakdown voltages and fast switching speeds, they also have less ringing.

Although certain preferred embodiments and methods have been disclosed herein, it will be apparent from the foregoing disclosure to those skilled in the art that variations and modifications of such embodiments and methods may be made without departing from the spirit and scope of the invention. For example, dielectric layer 34 may not be formed so that the semi-insulating semiconductor material forms directly on guard ring 32. Alternatively, a heavily doped polysilicon can be used in place of silicide layers 60 and 62 or metal layer 64. It is intended that the invention shall be limited only to the extent required by the appended claims and the rules and principles of applicable law.

What is claimed is:

1. A method for manufacturing a Schottky diode having a breakdown voltage of at least about 250 volts, comprising:
    providing a semiconductor material having a major surface, the semiconductor material of a first conductivity type;
    forming a guard ring of a second conductivity type in the semiconductor material, wherein the guard ring extends from the major surface into the semiconductor material;
    forming a first layer of dielectric material over a portion of the guard ring;
    forming a layer of semi-insulating semiconductor material over a portion of the guard ring and on the first layer of dielectric material;
    forming a second layer of dielectric material on the semi-insulating semiconductor material; and
    forming an electrically conductive material on a portion of the major surface.

2. The method of claim 1, further including removing the second layer of dielectric material after forming the electrically conductive material.

3. The method of claim 1, wherein forming the electrically conductive material includes:
    forming an etch mask over the second layer of dielectric material, wherein the etch mask has an opening that exposes a portion of the second layer of dielectric material;
    removing a portion of the second layer of dielectric material; and
    removing a portion of the semi-insulating semiconductor material exposed by removing the portion of the second layer of dielectric material to expose the portion of the major surface.

4. A method for manufacturing a Schottky diode having a breakdown voltage of at least about 250 volts, comprising:
    providing a semiconductor material having a major surface, the semiconductor material of a first conductivity type;
    forming a guard ring of a second conductivity type in the semiconductor material, wherein the guard ring extends from the major surface into the semiconductor material;
    forming a layer of semi-insulating semiconductor material over a portion of the guard ring, wherein the layer of semi-insulating semiconductor material is one of semi-insulating polycrystalline silicon or alpha-silicon; and
    forming an electrically conductive material on a portion of the major surface.

5. The method of claim 4, wherein forming the electrically conductive material includes forming the electrically conductive material within the guard ring.

6. The method of claim 5, wherein forming the electrically conductive material includes:
    forming a metal silicide from the portion of the major surface; and
    forming a metal layer on the metal silicide.

7. The method of claim 4, wherein forming the guard ring in the semiconductor material includes doping the semiconductor material.

8. A method for manufacturing a Schottky diode having a reverse voltage of at least about 250 volts, comprising:
   providing a semiconductor substrate having first and second major surfaces, the semiconductor substrate of a first conductivity type;
   forming a layer of epitaxial material on the first major surface, the layer of epitaxial material of the first conductivity type;
   forming a first layer of dielectric material on the layer of epitaxial material;
   forming an opening in the first layer of dielectric material, the opening exposing a portion of the layer of epitaxial material;
   forming a guard ring in the layer of epitaxial material, the guard ring of a second conductivity type and extending from the exposed portion of the layer of epitaxial material into the layer of epitaxial material;
   forming a second layer of dielectric material on the exposed portion of the layer of epitaxial material;
   forming a semi-insulating semiconductor material over a portion of the guard ring;
   forming a third layer of dielectric material on the semi-insulating semiconductor material; and
   forming an electrically conductive material over the layer of epitaxial material.

9. The method of claim 8, further including forming an electrically conductive material on the second major surface.

10. The method of claim 8, further including:
    forming an etch mask on a first portion of the third layer of dielectric material;
    etching a second portion of the third layer of dielectric material to expose a portion of the semi-insulating semiconductor material, the second portion unprotected by the etch mask;
    etching the exposed portion of the semi-insulating semiconductor material to expose a portion of the first layer of dielectric material and a portion of the second layer of dielectric material; and
    etching the exposed portions of the first and second layers of dielectric material to form a stacked structure having inner and outer sides and to expose a portion of the layer of epitaxial material within the stacked structure, a portion of the layer of epitaxial material adjacent the outer side of the stacked structure, and a portion of the guard ring.

11. The method of claim 10, wherein forming the electrically conductive material on the layer of epitaxial material includes forming a layer of metal on the stacked structure, the portion of the layer of epitaxial material adjacent the outer side of the stacked structure, the exposed portion of the layer of epitaxial material within the stacked structure, and the exposed portion of the guard ring.

12. The method of claim 11, wherein forming the layer of metal includes:
    forming a refractory metal on the stacked structure, the portion of the layer of epitaxial material adjacent the outer side of the stacked structure, the exposed portion of the layer of epitaxial material within the stacked structure, and the exposed portion of the guard ring; and
    forming a metal silicide from the portions of the refractory metal disposed on the layer of epitaxial material.

13. The method of claim 10, further including:
    removing the third layer of dielectric material after forming the metal silicide;
    removing a portion of the electrically conductive material from a portion of the semi-insulating semiconductor material; and
    removing a portion of the electrically conductive material adjacent to and spaced apart from the outer side of the annularly-shaped stacked structure.

* * * * *